United States Patent
Chen et al.

(10) Patent No.: US 8,887,872 B2
(45) Date of Patent: Nov. 18, 2014

(54) METHOD OF DETERMINING STATE OF CHARGE OF ENERGY STORAGE SYSTEM

(75) Inventors: Lei Chen, South Windsor, CT (US); William A. Veronesi, Hartford, CT (US); Stella M. Oggianu, Manchester, CT (US); Vladimir Blasko, Avon, CT (US)

(73) Assignee: Otis Elevator Company, Farmington, CT (US)

( * ) Notice: Subject to any disclaimer, the term of this patent is extended or adjusted under 35 U.S.C. 154(b) by 629 days.

(21) Appl. No.: 13/129,257

(22) PCT Filed: Nov. 17, 2008

(86) PCT No.: PCT/US2008/012860
§ 371 (c)(1),
(2), (4) Date: May 13, 2011

(87) PCT Pub. No.: WO2010/056226
PCT Pub. Date: May 20, 2010

(65) Prior Publication Data
US 2011/0226559 A1  Sep. 22, 2011

(51) Int. Cl.
*B66B 1/06* (2006.01)
*G01R 35/00* (2006.01)
*G01R 31/36* (2006.01)

(52) U.S. Cl.
CPC .......... *G01R 35/005* (2013.01); *G01R 31/361* (2013.01); *G01R 31/3651* (2013.01)
USPC .......................................... 187/290; 320/134

(58) Field of Classification Search
USPC ........ 187/277, 293, 297, 290; 307/64, 66, 69; 318/375, 376, 799–815; 320/106, 128, 320/134, 135, 162, 132
See application file for complete search history.

(56) References Cited

U.S. PATENT DOCUMENTS

| | | | |
|---|---|---|---|
| 5,808,445 A | 9/1998 | Aylor et al. | |
| 6,356,083 B1 | 3/2002 | Ying | |
| 6,359,419 B1 | 3/2002 | Verbrugge et al. | |
| 6,366,054 B1 | 4/2002 | Hoenig et al. | |
| 6,388,447 B1 | 5/2002 | Hall et al. | |
| 6,431,323 B2 | 8/2002 | Tajima et al. | |
| 6,435,311 B2 * | 8/2002 | Araki et al. | 187/290 |

(Continued)

FOREIGN PATENT DOCUMENTS

| | | |
|---|---|---|
| EP | 1691209 A1 | 8/2006 |
| JP | 2002238106 A | 8/2002 |

(Continued)

OTHER PUBLICATIONS

Patent Cooperation Treaty, Notification of International Search Report and Written Opinion, Jan. 22, 2009, 8 pages.

(Continued)

*Primary Examiner* — Anthony Salata
(74) *Attorney, Agent, or Firm* — Cantor Colburn LLP

(57) ABSTRACT

A method of determining state-of-charge (SOC) of a battery includes changing the SOC of the battery over a portion of a full SOC range to assure operation defined by open circuit voltage (Voc) of the battery following a known Voc-SOC profile; determining a Voc value; and estimating SOC of the battery based upon the Voc value and the known Voc-SOC profile.

21 Claims, 6 Drawing Sheets

(56) References Cited

U.S. PATENT DOCUMENTS

| | | | |
|---|---|---|---|
| 6,441,586 B1 | 8/2002 | Tate, Jr. et al. | |
| 6,460,658 B2 * | 10/2002 | Suga et al. | 187/290 |
| 6,474,447 B2 * | 11/2002 | Tajima et al. | 187/290 |
| 6,608,482 B2 | 8/2003 | Sakai et al. | |
| 6,630,814 B2 | 10/2003 | Ptasinski et al. | |
| 6,639,385 B2 | 10/2003 | Verbrugge et al. | |
| 6,653,817 B2 | 11/2003 | Tate, Jr. et al. | |
| 6,686,724 B2 | 2/2004 | Coates et al. | |
| 6,732,838 B1 * | 5/2004 | Okada et al. | 187/290 |
| 6,827,182 B2 * | 12/2004 | Araki | 187/290 |
| 6,841,972 B2 | 1/2005 | Koo | |
| 6,927,554 B2 | 8/2005 | Tate, Jr. et al. | |
| 7,375,497 B2 | 5/2008 | Melichar | |
| 7,497,304 B2 * | 3/2009 | Matsuoka | 187/393 |
| 7,525,284 B2 | 4/2009 | Iwane et al. | |
| 8,220,590 B2 * | 7/2012 | Chen et al. | 187/290 |
| 8,230,978 B2 * | 7/2012 | Agirman et al. | 187/290 |
| 8,590,672 B2 * | 11/2013 | Oggianu et al. | 187/290 |
| 2001/0017234 A1 | 8/2001 | Suga et al. | |
| 2002/0053490 A1 * | 5/2002 | Banno et al. | 187/290 |
| 2002/0113595 A1 | 8/2002 | Sakai et al. | |
| 2003/0214303 A1 | 11/2003 | Ying | |
| 2004/0035646 A1 | 2/2004 | Araki | |
| 2004/0162683 A1 | 8/2004 | Verbrugge et al. | |
| 2004/0257045 A1 | 12/2004 | Sada et al. | |
| 2005/0110498 A1 | 5/2005 | Plett | |
| 2005/0189918 A1 | 9/2005 | Weisgerber et al. | |
| 2005/0231165 A1 | 10/2005 | Melichar | |
| 2006/0091861 A1 | 5/2006 | Melichar | |
| 2006/0091862 A1 | 5/2006 | Melichar | |
| 2006/0091863 A1 | 5/2006 | Melichar | |
| 2006/0170426 A1 | 8/2006 | Atehortua et al. | |
| 2007/0145953 A1 | 6/2007 | Asai et al. | |
| 2007/0159137 A1 | 7/2007 | Verbrugge et al. | |
| 2007/0285061 A1 | 12/2007 | Zettel et al. | |
| 2007/0285097 A1 | 12/2007 | Zettel et al. | |
| 2008/0164849 A1 | 7/2008 | Ciaramitaro | |
| 2011/0247900 A1 * | 10/2011 | Blasko et al. | 187/247 |
| 2013/0075199 A1 * | 3/2013 | Kauppinen et al. | 187/247 |

FOREIGN PATENT DOCUMENTS

| | | |
|---|---|---|
| JP | 2004362828 A | 12/2004 |
| JP | 2005043339 A | 2/2005 |
| JP | 2006267014 A | 10/2006 |
| WO | 2008085171 A1 | 7/2008 |
| WO | 2010019126 A1 | 2/2010 |

OTHER PUBLICATIONS

Makul Jain, A.L.E., Michael Matthews, and John Weidner, Thermodynamic considerations of the reversible potential for the nickel electrode, Electrochimica Acta., 1998, 43(18): p. 2649-2660.

Bala S. Haran, B.N.P., and Ralph E. White, Theoretical analysis of metal hydride electrodes, Journal of the Electrochemical Soc., 1998, 145(12): p. 4082-4090.

A. Ledovskikh, D.D., W. J. J. Rey, and P. H. Notten, Modeling of hydrogen storage in hydride-forming materials: Statistical thermodynamics, Physical Review B, 2006, 73(1): p. 014106.

B. Wu, M.M., D. Brigham, R. Elder, R.E. White, A non-isothermal model of a nickel-metal hudride cell, Journal of Power Sources, 2001, 101: p. 149-157.

Ta, K.P., Solid-state diffusion-coefffceint measurement and modeling of intercalation materials, Department of Chemical Engineering, 1998, University of California, Berkeley.

Japanese Patent Office, Office Action, Feb. 5, 2013, 2 pages.

Abu-Sharkh S et al: "Rapid test and non-linear model characterisation of solid-state lithium-ion batteries", Journal of Power Sources, Elsevier SA, CH, vol. 130, No. 1-2, May 3, 2004, pp. 266-274.

Ceraolo M et al: "Microcycle-based Efficiency of Hybrid Vehicle Batteries", Vehicle Power and Propulsion, 2005 IEEE Conference Chicago, IL, USA Sep. 7-9, 2005, Piscataway, NJ, USA, IEEE, Sep. 7, 2005, pp. 60-64.

European Search Report for Application No. PCT/US2008012860 Mailed Mar. 13, 2014, 14 pages.

Feng Xuyun et al: "A battery model including hysteresis for State-of-Charge estimation in Ni-MH battery", Vehicle Power and Propulsion Conference, 2008. VPPC '08. IEEE, IEEE, Piscataway, NJ, USA, Sep. 3, 2008, pp. 1-5, XP031363129.

Vasebi et al: "A novel combined battery model for state-of-charge estimation in lead-acid batteries based on extended Kalman filter for hybrid electric vehicle applications", Journal of Power Sources, Elsevier SA, CH, vol. 174, No. 1, Nov. 7, 2007, pp. 30-40, XP022335864.

* cited by examiner

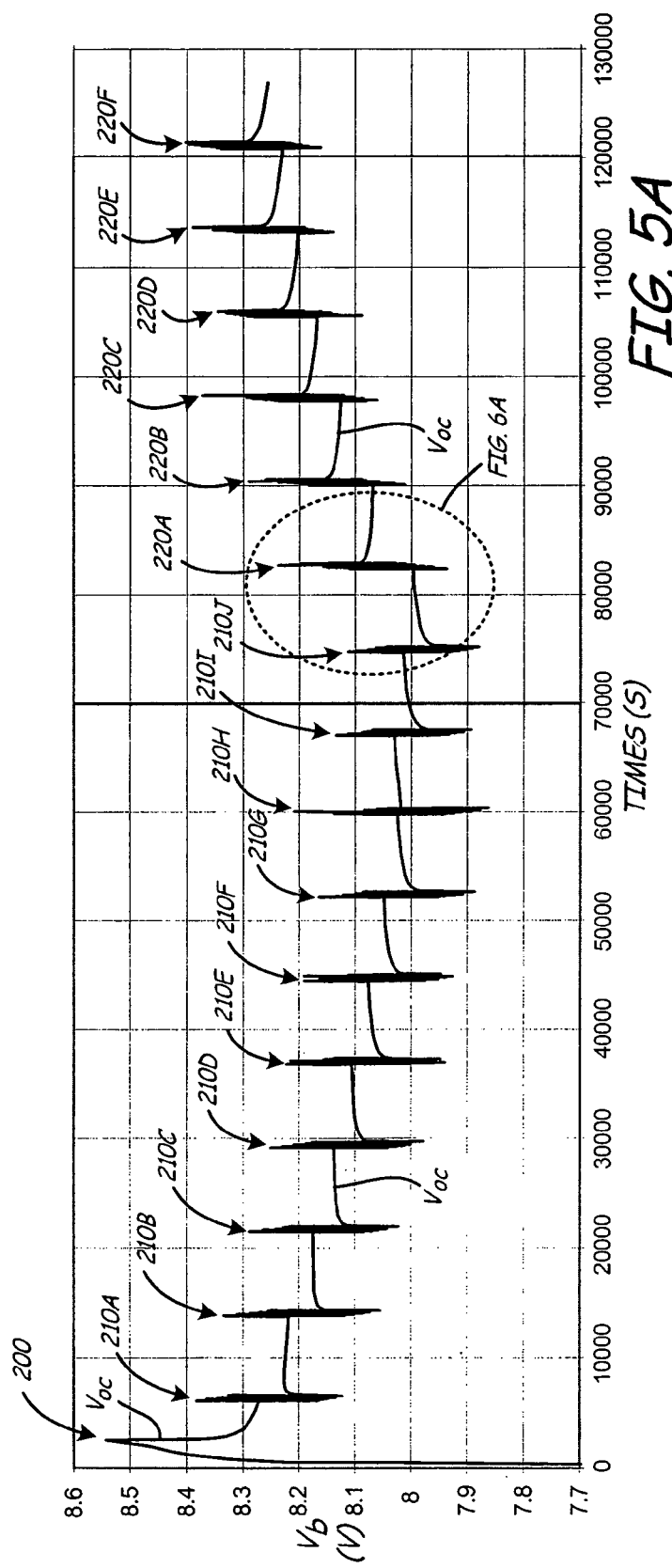
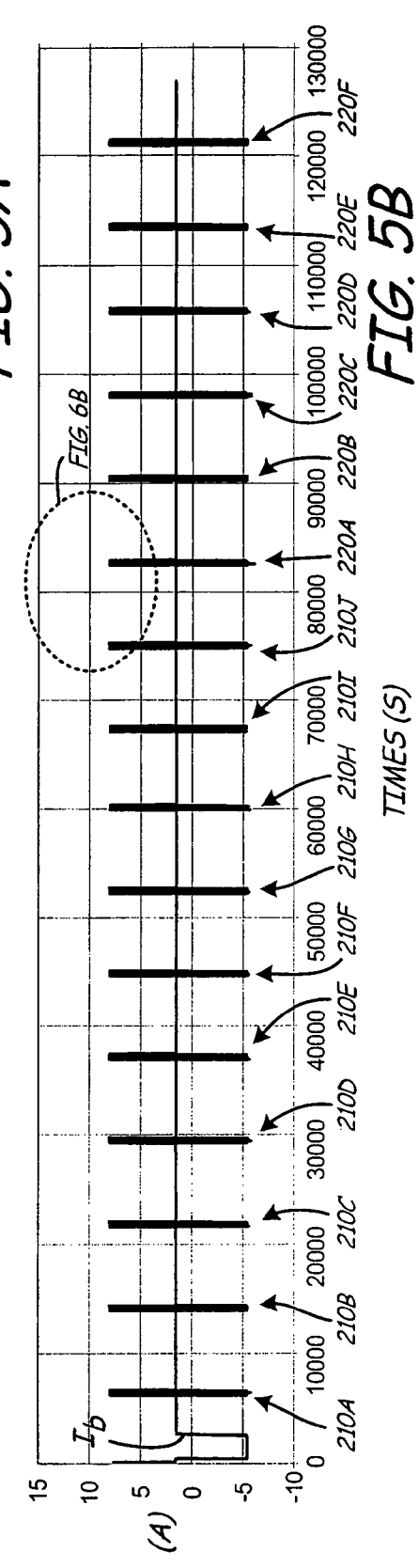
FIG. 5A
FIG. 5B

METHOD OF DETERMINING STATE OF CHARGE OF ENERGY STORAGE SYSTEM

BACKGROUND

The present invention relates to determination of state-of-charge of a battery.

The power demands for operating elevators range from positive, in which externally generated power (such as from a power utility) is used, to negative, in which the load in the elevator drives the motor so it produces electricity as a generator. The use of the motor to produce electricity as a generator is commonly called regeneration. In conventional systems, if the regenerated energy is not provided to another component of the elevator system or returned to the utility grid, it is dissipated through a dynamic brake resistor or other load. In this configuration, all demand remains on the power utility to supply power to the elevator system, even during peak power conditions (e.g., when more than one motor starts simultaneously or during periods of high demand). Thus, components of the elevator system that deliver power from the power utility need to be sized to accommodate peak power demand, which may by more costly and require more space. Also, the regenerated energy that is dissipated is not used, thereby decreasing the efficiency of the power system.

In addition, an elevator drive system is typically designed to operate over a specific input voltage range from a power supply. The components of the drive have voltage and current ratings that allow the drive to continuously operate while the power supply remains within the designated input voltage range. In conventional systems, when the utility voltage sags, the elevator system faults. In conventional systems, when a utility power failure occurs or under poor power quality conditions, the elevator may become stalled between floors in the elevator hoistway until the power supply returns to normal operation.

Elevator drive systems may incorporate a secondary power supply that is controlled to deliver supplemental power to the elevator hoist motor during periods of positive power demand, and store power from the power utility and/or the elevator hoist motor during periods of zero or negative power demand. For example, U.S. Pat. No. 6,431,323, Tajima et al., describes an elevator drive system including an energy storage apparatus and a controller for controlling charging and discharging operation of the energy storage apparatus based on a charging target value (e.g., a charge value based on the time of day). However, this type of control does not provide a direct method for gauging future energy demands of the elevator drive system, and does not control the upper and lower charge limits of the energy storage apparatus.

Elevators equipped with regenerative drives provide the possibility of recovering a significant portion of the energy employed to move the load and counterweight. The energy recovered as such may be sent back to the building grid or stored locally for future use by the elevators or other needs in the building which houses the elevators. Utilizing the stored energy to power the elevators is of particular interest to customers because various benefits and functionalities may then be realized, which include feeder size reduction enabled by the boost from the storage devices, and rescue operation resulting from an energy source secondary to the grid. It is essential to control the state of charge (SOC) of the battery to ensure the operability of the system, preserve battery life, and guarantee safe operation.

The battery SOC estimation methods reported in the prior art are generally based on an imprecise correlation between the SOC and measurable parameters such as battery module (or battery pack) voltage, current, and temperature. The complexity of the processes involved in battery operation makes the SOC estimate prone to error. Coulomb counting, based upon measurements by current sensors, is usually combined with a Kalman filter to estimate the state of the system. However, systematic errors that are not random may lead to cumulative error that is unlikely to be bounded. As a result, the state-of-the-art SOC estimators are capable of estimating the SOC with no better accuracy than ±15% in terms of the absolute value of the capacity of a battery. Consequently, the battery may operate out of the desirable SOC regime, which can potentially reduce the lifetime of the battery and degrade the energy efficiency of the battery. To avoid operation out of the desirable SOC regime it is advantageous to calibrate the SOC of the battery regularly, and thereby reset any SOC estimate and bound the error in that estimate.

Battery SOC calibration techniques are critical to the mobile communication and hybrid electrical vehicle industries. U.S. Pat. No. 6,630,814 by Ptasinski et al., aimed at calibrating the battery of mobile phones, teaches a coulomb counting method to regularly identify throughout the lifetime of a battery the currently available capacity. The method relies on fully charging and discharging the battery. U.S. Pat. No. 6,630,814 also teaches an alternative capacity estimation method based upon an aging trend of the battery when complete charging and discharging are not allowed. There are several drawbacks to the complete charging and discharging method. First, it requires a long time to complete, which may not be feasible because of the continuous operation of the battery. Second, fully charging and discharging the battery (representing 100% depth of discharge (DOD)) is likely to accelerate the degradation of the battery, resulting in significantly shorter battery life. Because the duty cycle of an elevator is often higher than that of average mobile phones, and the lifetime of the battery in an elevator system needs to be much longer, the methods similar to those disclosed by U.S. Pat. No. 6,630,814 may not be applicable to elevators.

U.S. Pat. No. 6,841,972 by Koo teaches a method of qualitatively resetting the SOC of the battery in hybrid electric vehicles based on the relationship between SOC and battery parameters. This method does not require fully charging and discharging the battery, and it can be implemented on-line. The SOC of a battery is divided into 15% to 25% brackets. The actual SOC of the battery is qualitatively estimated and assigned to one of the brackets.

Other patents and published applications discussing determination of battery state-of-charge include: U.S. Pat. No. 6,356,083 by Ying; U.S. Pat. No. 6,359,419 by Verbrugge et al.; U.S. Pat. No. 6,441,586 by Tate, Jr. et al.; U.S. Pat. No. 6,639,385 by Verbrugge et al.; U.S. Pat. No. 6,653,817 by Tate, Jr. et al.; U.S. Pat. No. 6,686,724 by Coates et al.; U.S. Pat. No. 6,927,554 by Tate, Jr. et al.; U.S. Pat. No. 7,375,497 by Melichar; U.S. Publication No. 2003/0214303 by Ying; U.S. Publication No. 2004/0162683 by Verbrugge et al.; U.S. Publication No. 2005/0189918 by Weisgerber et al.; U.S. Publication No. 2005/0231165 by Melichar; U.S. Publication No. 2006/0091861 by Melichar; U.S. Publication No. 2006/0091862 by Melichar; U.S. Publication No. 2006/0091863 by Melichar; U.S. Publication No. 2007/0159137 by Verbrugge et al.; U.S. Publication No. 2007/0285061 by Zettel et al.; U.S. Publication No. 2007/0285097 by Zettel et al.; and U.S. Publication No. 2008/0164849 by Ciaramitaro.

Various patents and published patent applications on SOC estimation do not adequately provide techniques of calibrating and resetting the battery on a quantitative basis. Additionally, the implementation of those calibration methods may have negative impact on the battery lifetime; hence, battery calibration methods require careful evaluation.

SUMMARY

A battery state calibration method makes use of an observable empirical relationship between open circuit voltage, $V_{oc}$, and SOC, but overcomes the dependence on charging history by subjecting a battery to a controlled partial charge or discharge. The partial charging or discharging assures operation defined by $V_{oc}$ following a known $V_{oc}$-SOC profile, such as a charge or discharge boundary curve, having a known $V_{oc}$-SOC correlation. $V_{oc}$ is directly measured or estimated in a shorter time as a result of enhanced relaxation dynamics of a battery resulting from regulated micro-cycles that counteract the relaxation behavior with longer time constant associated with prior usage. SOC is then estimated based on the $V_{oc}$ value and the known $V_{oc}$-SOC correlation.

BRIEF DESCRIPTION OF THE DRAWINGS

FIGS. 5A and 5B show battery voltage and battery current, respectively, of a battery module intermittently micro-cycled to simulate elevator operation.

DETAILED DESCRIPTION

Figure 1:
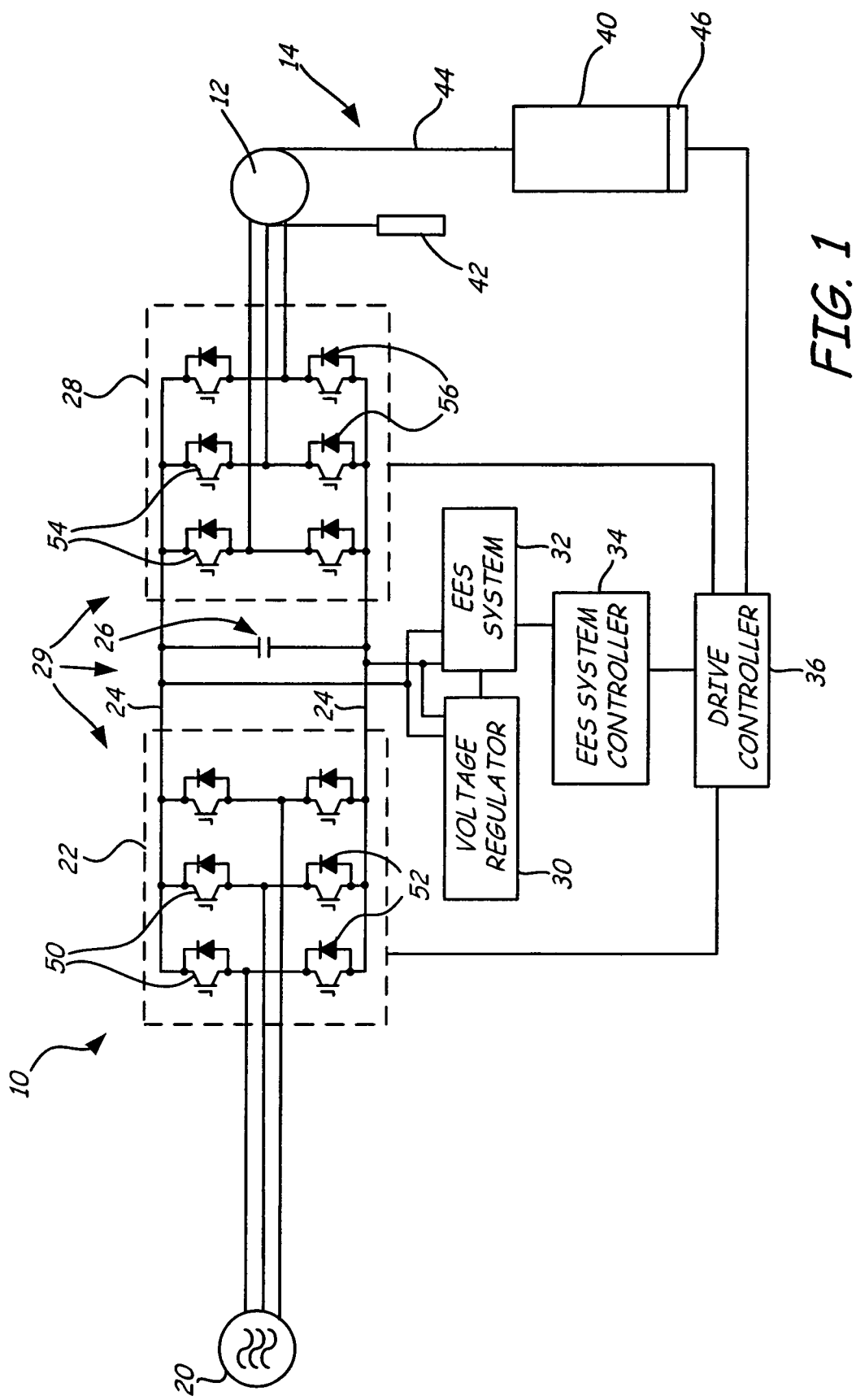
FIG. 1 is a schematic view of an elevator power system including a regenerative drive and an electrical energy storage system.

FIG. 1 is a schematic view of power system 10 including primary power supply and distribution system 20, power converter 22, DC bus 24, smoothing capacitor 26, power inverter 28, voltage regulator 30, electrical energy storage (EES) system 32, EES system controller 34, and drive controller 36. Power converter 22, DC bus 24, smoothing capacitor 26, and power inverter 28 are included in regenerative drive 29. Primary power supply and distribution system 20 may be an electrical utility, such as a commercial power source. EES system 32 includes a device or a plurality of devices capable of storing electrical energy. Elevator 14 includes elevator car 40 and counterweight 42 that are connected through roping 44 to hoist motor 12. Elevator 14 also includes load sensor 46, connected to drive controller 36, for measuring the weight of the load in elevator car 40.

As will be described herein, power system 10 is configured to control power exchanged between elevator hoist motor 12, primary power supply and distribution system 20, and/or EES system 32 as a function of the power demand (positive or negative) of elevator hoist motor 12 and the state-of-charge (SOC) of EES system 32, and specifications for grid usage.

For example, when power demand of elevator hoist motor 12 is positive, power system 10 may drive hoist motor 12 from primary power supply and distribution system 20 and EES system 32 in a ratio that is a function of the magnitude of the demand and the state-of-charge of EES system 32. As another example, when power demand of elevator hoist motor 12 is negative, power system 10 may provide the power generated by elevator hoist motor 12 to power supply and distribution system 20 and EES system 32 in a ratio that is a function of the state-of-charge of EES system 32. Power system 10 also controls distribution of power between primary power supply and distribution system 20 and EES system 32 when the power demand of elevator hoist motor 12 is approximately zero (i.e., an idle period), and between EES system 32 and elevator hoist motor 12 in the event of failure of primary power supply and distribution system 20.

Power converter 22 and power inverter 28 are connected by DC bus 24. Smoothing capacitor 26 is connected across DC bus 24. Primary power supply and distribution system 20 provides electrical power to power converter 22. Power converter 22 is a three-phase power inverter that is operable to convert three-phase AC power from primary power supply and distribution system 20 to DC voltage on DC bus 24. In one embodiment, power converter 22 comprises a plurality of power transistor circuits including parallel-connected transistors 50 and diodes 52. Each transistor 50 may be, for example, an insulated gate bipolar transistor (IGBT). The controlled electrode (i.e., gate or base) of each transistor 50 is connected to drive controller 36. Drive controller 36 controls the power transistor circuits to convert the three-phase AC power from primary power supply and distribution system 20 to DC voltage on DC bus 24. Smoothing capacitor 26 smoothes the rectified power provided by power converter 22 on DC bus 24. It is important to note that while primary power supply and distribution system 20 is shown as a three-phase AC power supply and distribution system, power system 10 may be adapted to receive power from any type of power source, including (but not limited to) a single phase AC power source and a DC power source.

The power transistor circuits of power converter 22 also allow power on DC bus 24 to be inverted and provided to primary power supply and distribution system 20. In one embodiment, drive controller 36 employs pulse width modulation (PWM) to produce gating pulses so as to periodically switch transistors 50 of power converter 22 to provide a three-phase AC power signal to primary power supply and distribution system 20. This regenerative configuration reduces the demand on primary power supply and distribution system 20.

Power inverter 28 is a three-phase power inverter that is operable to invert DC power from DC bus 24 to three-phase AC power. Power inverter 28 comprises a plurality of power transistor circuits including parallel-connected transistors 54 and diodes 56. Each transistor 54 may be, for example, an insulated gate bipolar transistor (IGBT). The controlled electrode (i.e., gate or base) of each transistor 54 is connected to drive controller 36, which controls the power transistor circuits to invert the DC power on DC bus 24 to three-phase AC output power. The three-phase AC power at the outputs of power inverter 28 is provided to hoist motor 12. In one embodiment, drive controller 36 employs PWM to produce gating pulses to periodically switch transistors 54 of power inverter 28 to provide a three-phase AC power signal to hoist motor 12. Drive controller 36 may vary the speed and direction of movement of elevator 14 by adjusting the frequency, phase, and magnitude of the gating pulses to transistors 54.

In addition, the power transistor circuits of power inverter 54 are operable to rectify power that is generated when elevator 14 drives hoist motor 12. For example, if hoist motor 12 is generating power, drive controller 36 controls transistors 54 in power inverter 28 to allow the generated power to be converted and provided to DC bus 24. Smoothing capacitor 26 smoothes the converted power provided by power inverter 28 on DC bus 24. The regenerated power on DC bus 24 may be used to recharge the storage elements of EES system 32, or may be returned to primary power supply and distribution system 20 as described above.

Hoist motor 12 controls the speed and direction of movement between elevator car 40 and counterweight 42. The power required to drive hoist motor 12 varies with the acceleration and direction of elevator 14, as well as the load in elevator car 40. For example, if elevator car 40 is being accelerated, run up with a load greater than the weight of counterweight 42 (i.e., heavy load), or run down with a load less than the weight of counterweight 42 (i.e., light load), power is required to drive hoist motor 12. In this case, the power demand for hoist motor 12 is positive. If elevator car 40 runs down with a heavy load, or runs up with a light load, elevator car 40 drives hoist motor 12 and regenerates energy. In this case of negative power demand, hoist motor 12 generates AC power that is converted to DC power by power inverter 28 under the control of drive controller 36. As described above, the converted DC power may be returned to primary power supply and distribution system 20, used to recharge EES system 32, and/or dissipated in a dynamic brake resistor connected across DC bus 24. If elevator 14 is leveling or running at a fixed speed with a balanced load, it may be using a lesser amount of power. If hoist motor 12 is neither motoring nor generating power, the power demand of hoist motor 12 is approximately zero.

It should be noted that while a single hoist motor 12 is shown connected to power system 10, power system 10 can be modified to power multiple hoist motors 12. For example, a plurality of power inverters 28 may be connected in parallel across DC bus 24 to provide power to a plurality of hoist motors 12. In addition, while EES system 32 is shown connected to DC bus 24, EES system 32 may alternatively be connected to one phase of the three phase input of power converter 22.

EES system 32 may include one or more devices capable of storing electrical energy that are connected in series or parallel. EES system 32 includes at least one rechargeable battery, which may include any of nickel-cadmium (Ni—Cd), lead acid, nickel-metal hydride (Ni-MH), lithium ion (Li-ion), lithium ion polymer (Li-Poly), nickel-iron, nickel-zinc, zinc/alkaline/manganese dioxide, zinc-bromine flow, vanadium flow, and sodium-sulfur batteries. In some embodiments, EES system 32 may also include at least one supercapacitor, which may include symmetric or asymmetric supercapacitors. EES system 32 may include one type of storage device or may include combinations of the same or different types of storage devices.

Power system 10 addresses the power demand of hoist motor 12 with both primary power supply and distribution system 20 and EES system 32. This reduces the overall power demand on primary power supply and distribution system 20, which permits a reduction in the size (and, consequently, cost) of components that deliver power from primary power supply and distribution system 20 to power system 10 (e.g., power converter 22). In addition, by controlling the share of power provided by EES system 32 as a function of its state-of-charge (SOC), the life of EES system 32 is extended. Furthermore, power system 10 can provide rescue and extended service operation after failure of primary power supply 10 by delivering power to and from EES system 32 to address demand of hoist motor 12.

Proper operation of power system 10 and particularly EES system 32 requires that SOC be monitored. Maintaining SOC within a desired regime (or operating range) ensures the availability of power from EES system 32 when needed. In addition, maintaining SOC within the desired operating range can extend the lifetime of any batteries used to store electrical energy.

EES system controller 34 monitors SOC of EES system 32, and controls charging and discharging of the EES system to maintain EES system 32 within the desired SOC regime. EES system controller 34 calibrates the state of charge of a battery based on SOC-open circuit voltage ($V_{oc}$) correlation by partially charging or discharging the battery to eliminate the charge history dependence which typically confounds such correlations. The depth of discharge required to determine SOC is much less than prior SOC calibration techniques that require complete charging or discharging of the battery. Minimizing the depth of discharge extends battery life relative to the full charge or full discharge methods.

EES system controller 34 first determines qualitatively whether the SOC is above or below a desired SOC regime or range by comparing the battery voltage under a certain load with a predetermined voltage. If the SOC is above the desired SOC regime, the calibration will be regulated to cause the SOC to decrease during a partial discharging of EES system 32; otherwise, the calibration will be directed to increase the SOC during a partial charging of EES system 32.

In one embodiment, EES system controller 34 sets battery management strategy during SOC calibration such that the SOC increases or decreases monotonically over a period of time by proportionally decreasing the discharging or increasing the charging during idle periods (i.e., when hoist motor 12 is not operating). As the SOC change reaches ca. 20% or the minimal value that allows the $V_{oc}$ to traverse to a known $V_{oc}$-SOC correlation (i.e. a charge or discharge boundary curve), EES system controller 34 will determine or estimate a steady state value of $V_{oc}$, using conventional methods that require a substantial time, or using an expedited method that estimates steady state $V_{oc}$ based on a shorter observation period. In order to estimate the $V_{oc}$ of a battery without a long rest time, a predictive method can be used that allows for the estimation of a $V_{oc}$ with short relaxation within several minutes to tens of minutes instead of hours. This method can provide an approximation that serves the purpose of ensuring the operability and controllability of the system.

The partial charging/discharging, leading to a specific change in SOC for a battery, can be controlled by EES controller 34 based on Coulomb counting. Other parameters such as temperature, temperature change rate, voltage, and voltage change rate are monitored during the SOC swing to prevent the battery from being overcharged or over-discharged. Note that determining the sign of the change in SOC does not require accurately computing the charges; instead, the increase or decrease of SOC can be determined by observing the trend of voltage when load is removed, i.e. open circuit condition. For instance, except under voltage relaxation periods, voltage decay typically indicates increase in SOC prior to the rest, and voltage recovery indicates decrease in SOC.

In the following discussion, battery SOC calibration will be described using examples based upon characteristics of a Ni-MH battery. The rechargeable nickel-metal hydride (Ni-MH) battery is a preferred energy storage device for elevator applications due to its energy and power density, construction from environmentally benign materials, and safety. However, other battery types may also be used and present similar challenges to SOC monitoring. The principles and methodology discussed are applicable to other battery types.

The open circuit voltage ($V_{oc}$) of a battery (such as a Ni-MH battery) equals the difference in the electrode potentials of the battery when mass transport and parasitic reactions are negligible. The electrode potential at equilibrium is a thermodynamic value that depends on the electrode material composition and environment conditions. Hence, the $V_{oc}$ may be an indicator of the state of charge of the battery. The models of the positive electrode ($Ni(OH)_2$) and negative electrode (metal hydride (MH)) of a Ni-MH battery have been proposed by several researchers and validated under relevant conditions. See, Mukul Jain, A. L. E., Michael Matthews and John Weidner, *Thermodynamic considerations of the reversible potential for the nickel electrode*. Electrochimica Acta., 1998, 43(18): p. 2649-2660; and Bala S. Haran, B. N. P., and Ralph E. White, *Theoretical analysis of metal hydride electrodes*. Journal of the Electrochemical Soc., 1998, 145(12): p. 4082-4090, and A. Ledovskikh, D. D., W. J. J. Rey, and P. H. Notten, *Modeling of hydrogen storage in hydride forming materials: Statistical thermodynamics*. Physical Review B, 2006, 73(1): p. 014106. The practical difficulty of computing SOC directly from $V_{oc}$ stems from the non-ideal mixture of electrode species and non-equilibrium nature of the electrode under practical conditions. Moreover, the observed correlation between $V_{oc}$ and SOC exhibits a pronounced hysteresis or dependence on the history of charging or discharging of the battery.

Figure 2:
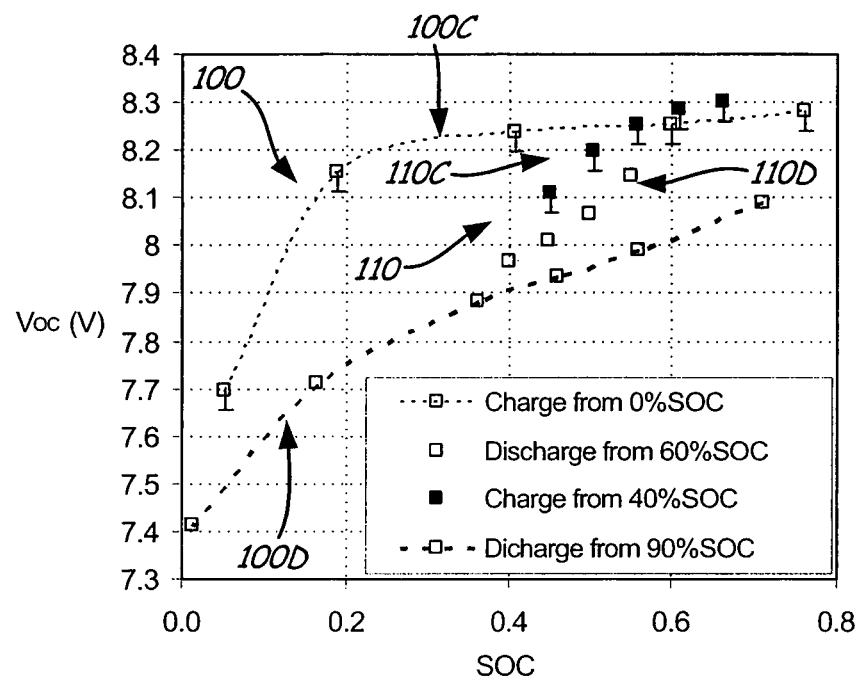
FIG. 2 shows an experimentally observed relationship between $V_{oc}$ of a Ni-MH battery module with six single cells and state-of-charge (SOC) for two operation regimes.

FIG. 2 shows an experimentally observed relationship between the $V_{oc}$ of a Ni-MH battery module (6.5 Ah), consisting of 6 single cells with a nominal voltage of 1.2V per cell, and its SOC for two operation regimes. One procedure or operating regime for obtaining the $V_{oc}$-SOC relationship shown in FIG. 2 was to charge or discharge the battery module from or to zero SOC continuously with constant current and stop the current at partial SOCs for recording the corresponding $V_{oc}$ after the battery was allowed to be at open circuit for 2 hours for each SOC. The $V_{oc}$-SOC profile resulting from this procedure is referred as boundary loop 100, and includes charge profile 100C and discharge profile 100D.

Another procedure or operating regime is to charge and discharge the battery from a partial SOC between zero charge and full capacity and record the $V_{oc}$ using the same method. This $V_{oc}$-SOC profile is referred to as inner loop 110 and is shown in FIG. 2 by the hollow and solid square symbols. Inner loop 110 includes charge profile 110C and discharge profile 110D.

In both boundary loop 100 and inner loop 110, hysteresis was observable and repeatable. The hysteresis phenomenon for Ni-MH batteries may originate from the proton intercalation concomitant with the conversion between $Ni(OH)_2$ and NiOOH of positive electrodes. The hysteresis is typically dealt with by using empirical equations in most cases B. Wu, M. M., D. Brigham, R. Elder, R. E. White, *A non-isothermal model of a nickel-metal hydride cell*. Journal of Power Sources, 2001. 101: p. 149-157. It is seen that the difference in estimated SOCs associated with the same $V_{oc}$ based upon boundary loop 100 and inner loop 110 is tremendous; hence, the accuracy of a $V_{oc}$-based SOC estimation is largely dependent on choosing the correct $V_{oc}$-SOC profile to match the battery charging history.

Figure 3A:
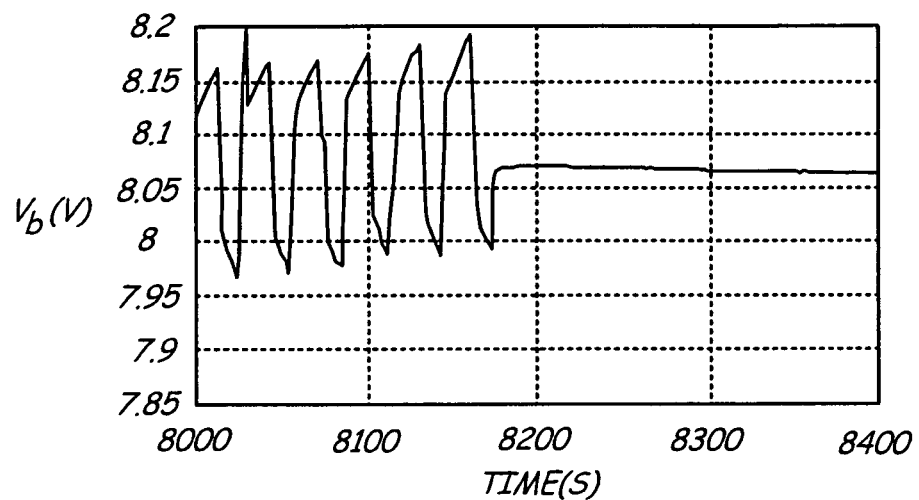
FIGS. 3A and 3B show battery voltage and battery current, respectively, during a series of unbalanced charging micro-cycles.
Figure 3B:
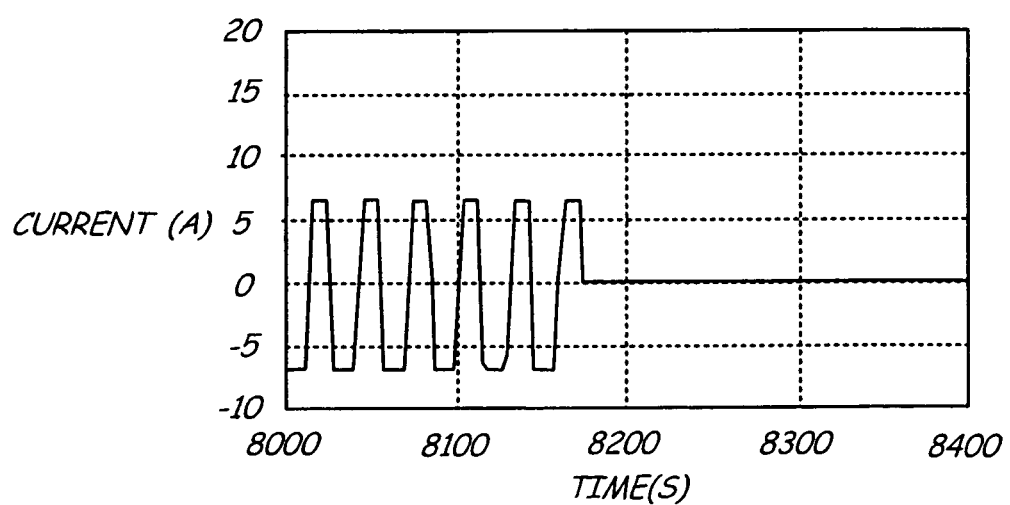

For a regenerative elevator system such as shown in FIG. 1, the load profile of the usage of a battery may be more accurately represented by micro-cycles that consist of both charging and discharging in one cycle and cause small SOC excursion within the cycle and slower drift of the battery SOC over a period of time. A series of such cycles are shown in FIGS. 3A and 3B.

Figure 4:
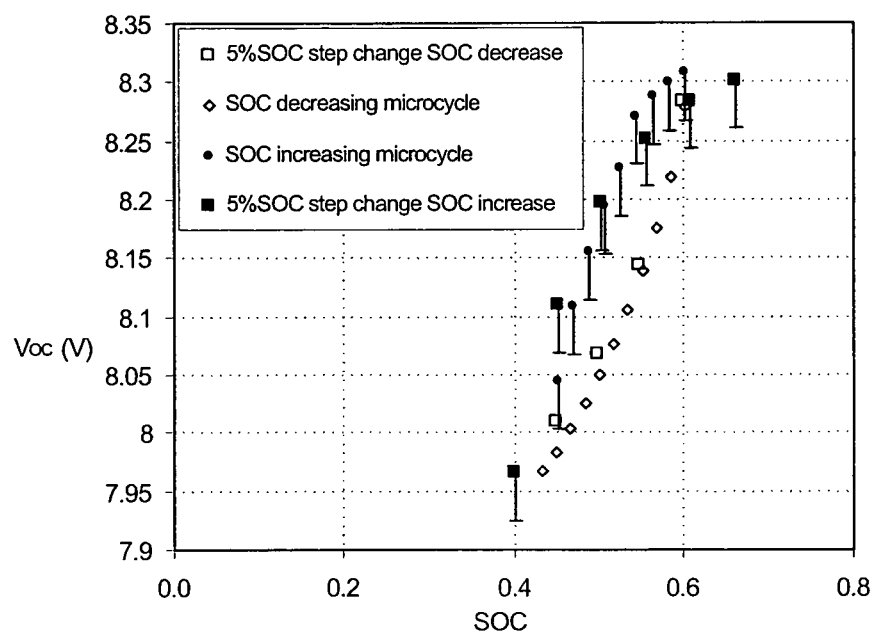
FIG. 4 is a graph showing a comparison of $V_{oc}$-SOC profiles resulting from continuous charging/discharging and from charge/discharge micro-cycles.

The $V_{oc}$-SOC relationship resulting from the micro-cycling that simulates elevator operation is shown in FIG. 4 and is compared with that resulting from continuous charging and discharging presented in FIG. 2. The similarity of the two $V_{oc}$-SOC profiles suggests that the correlation of $V_{oc}$-SOC is primarily determined by the state of the electrode materials. In addition, it was observed in these tests that a maximum, invariant SOC change (ca. 20% SOC) caused the subsequent $V_{oc}$-SOC correlation to traverse $V_{oc}$-SOC boundary loop 100. The SOC change that would be effective for eliminating charge or discharge history effects (pseudo-steady-state assumed for $V_{oc}$) and forcing subsequent $V_{oc}$-SOC correlation to lie on either profile 100C or profile 100D of boundary loop 100 is likely to be less than 20% for other SOC values greater or lower than those depicted for inner loop 110 of FIG. 2, because boundary profiles 100C and 100D tend to converge as the SOC approaches high or low values. A general process of assuring that the battery either charges or discharges by about a 20% change relative to full charge forms a basis for conditioning the battery in preparation for estimating SOC. This type of calibration process uses a swing in SOC that is large enough to eliminate the uncertainty of $V_{oc}$-SOC correlation arising from hysteresis, while minimizing the swing in order to preserve battery life.

An observation that supports the feasibility of predicting $V_{oc}$ with relatively short rest time is that the relaxation of the battery may be facilitated when both charge decreasing micro-cycles and charge increasing micro-cycles are present. These micro-cycles appeared to expedite the relaxation of the open circuit voltage possibly by canceling the underlying concentration gradient build-up resulting from SOC change. A mass transport basis for the relaxation behavior can be found from the dissertation by Ta, K. P., *Solid-state diffusion-coefficient measurement and modeling of intercalation materials, Department of Chemical Engineering*, 1998, University of California, Berkeley. This is evidenced by the results shown in FIGS. 5A and 5B, which display battery voltage $V_b$ and battery current $I_b$ profiles, respectively, of the cycling from which the $V_{oc}$-SOC dependence in FIG. 4 was obtained.

The tests presented in FIGS. 5A and 5B started with a battery module fully discharged. FIGS. 5A and 5B show an initial continuous charge 200 followed by a series of SOC decreasing micro-cycles 210A-210J and a series of SOC increasing micro-cycles 220A-220F. In FIG. 5A, it can be seen that the relaxation behavior resulting from SOC decreasing micro-cycles 210A-210J is different from the relaxation behavior of continuous charge 200, and the relaxation behavior of SOC increasing micro-cycles 220A-220F.

In FIG. 5A, continuous charge 200 resulted in a 60% SOC increase at the beginning. Continuous charge 200 created a significant concentration gradient and consequently longer relaxation time. Subsequent micro-cycles 210A-210J, which reduced the SOC gradually at a slower pace, seemed to allow the subsequent relaxation to proceed more rapidly. Charge decreasing micro-cycles 210A-210J were followed by a set of charge increasing micro-cycles 220A-220F. Micro-cycles 220A appeared to lead to faster $V_{oc}$ decay dynamics, even though all the preceding micro-cycles 210A-210J caused the SOC to drift by 20% as a whole over a period of roughly 20 hours. It was observed that the relaxation of $V_{oc}$ at each intermittent open circuit condition during the charge decreasing period produced by micro-cycles 210A-210J showed more or less similar time constants. The history effect resulting from the initial continuous charging 200 did not appear to affect the behavior significantly, presumably, due to its diminishing effect over time. The change in relaxation in FIG. 5A as the SOC change was reversed can be more clearly seen in FIG. 6A, which shows micro-cycles 210J and 220A in greater detail.

Figure 6A:
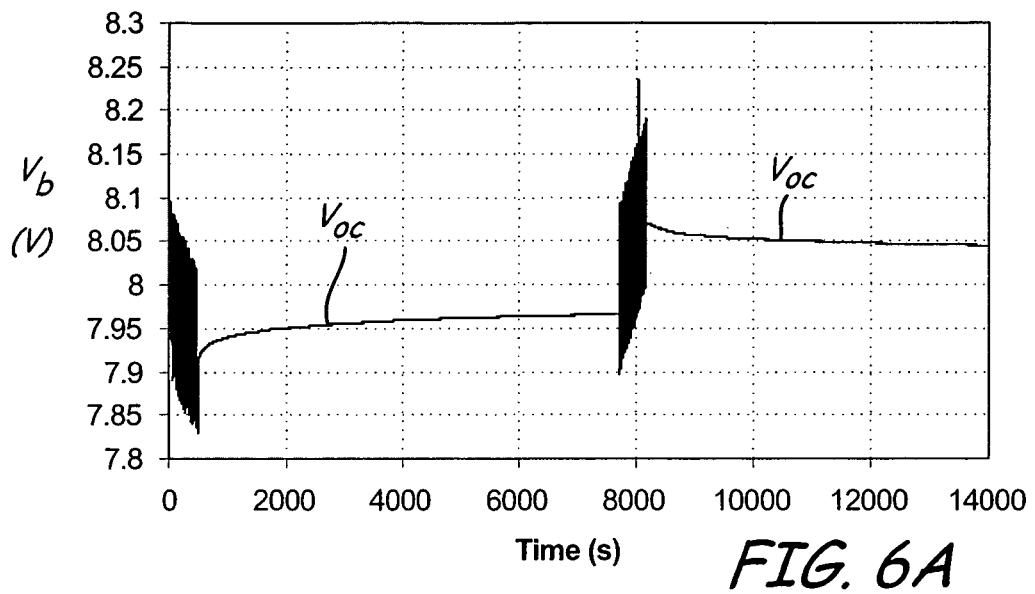
FIGS. 6A and 6B are expanded views of a portion of FIGS. 5A and 5B showing battery voltage and battery current at a transition between a first set of micro-cycles resulting in charge decreases and a second set of micro-cycles resulting in charge increases.
Figure 6B:
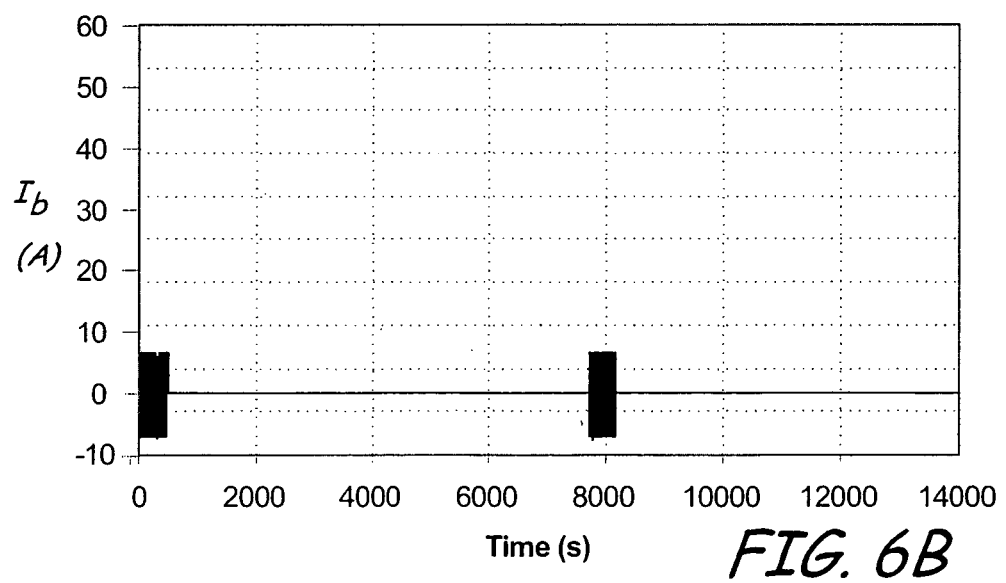

Based on the relaxation trace of $V_{oc}$ in FIG. 6A, it is possible to fit the initial relaxation data of a short time (for instance minutes or tens of minutes during the idling time) to predict a pseudo-$V_{oc}$ that is a reasonable approximation of steady state $V_{oc}$. The time constants for fitting the $V_{oc}$ trace range from 100 s to 10000 s depending on the cycling history of a battery and requirements on errors of the fit. However, the $V_{oc}$ variation becomes substantially smaller after ca. 1000 s. Therefore, the estimate of steady state $V_{oc}$ may be derived by analyzing the $V_{oc}$ relaxation data obtained during the early time of open circuit condition, which can be less than tens of minutes when the relaxation dynamics is enhanced. A relaxation time may be made available during low elevator usage time based upon prior daily traffic profile of the elevator. The predictive method is implemented to reduce the requirement for extremely long relaxation time for precisely recording $V_{oc}$.

The adjustment of the charge increasing or charge decreasing operation for the battery in a regenerative elevator system can be realized through the energy management strategies disclosed above. Therefore, a predictive $V_{oc}$ method may be implemented to estimate the $V_{oc}$ in order to calibrate the SOC based on the $V_{oc}$-SOC correlation stored in a database. Alternatively, the steady state $V_{oc}$ may be identified through a battery terminal voltage model that requires more parameters of the battery.

The partial charging or discharging may be synchronized with the traffic profile of an elevator system to minimize the interruption of the elevator operation during calibration. A typical daily energy profile shown in FIG. 7 reveals that the SOC of EES system 32 could drift a noticeable amount without the intervention of the EES system controller 34, one primary function of which is to minimize the SOC excursion. Therefore, it is possible to obtain a gross amount of SOC change in a reasonable duration to perform the calibration method.

Figure 7:
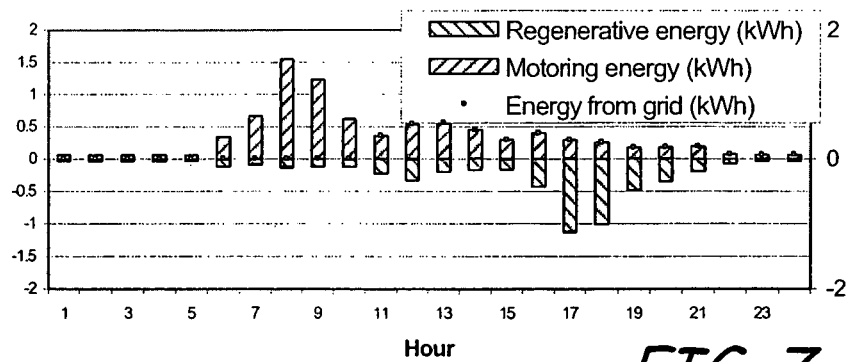
FIG. 7 shows an example of a daily energy profile of an elevator.

One embodiment makes use of the SOC excursion based upon a traffic profile in order to allow the SOC to drift a gross amount of no more than 20% or the minimal value necessary for assuring the effect of usage history is minimized for a particular type of battery. A typical hourly energy profile associated with a traffic profile for a regenerative elevator is shown in FIG. 7. For such a traffic/energy profile, the system can easily cause an SOC change in a greater amount to set the battery to a state that has a known $V_{oc}$-SOC correlation, typically on the boundary loop, with minimal interference of the energy fluxes.

This invention aids life extension of a battery by providing accurate estimation of battery SOC and thereby allowing systems to avoid operation outside of desirable SOC levels. For regenerative elevator systems, the battery will likely operate longer each day than a battery in a typical hybrid electric vehicle; hence, the need for calibration may be greater than for the hybrid electric vehicle. Benefits achieved by the calibration method include improved reliability, low maintenance, and infrequent battery replacement. Also, with good battery life extension strategies and technology, the size of the battery can be optimized and the cost for delivering a given level of performance can be reduced.

Although the present invention has been described with reference to preferred embodiments, workers skilled in the art will recognize that changes may be made in form and detail without departing from the spirit and scope of the invention. For example, the battery SOC calibration has been described in the context of a particular elevator system shown in FIG. 1, but is applicable to a wide variety of different elevator systems, as well as other systems in which battery SOC calibration is needed.

The invention claimed is:

1. A method of determining state-of-charge (SOC) of a battery, the method comprising:
   performing SOC calibration by changing the SOC of the battery over a portion of a full SOC range to assure operation defined by open circuit voltage (Voc) of the battery following a known Voc-SOC profile;
   determining a Voc value; and
   estimating SOC of the battery based upon the Voc value and the known Voc-SOC profile.

2. The method of claim 1 and further comprising: determining whether SOC is above a desired SOC range.

3. The method of claim 2, wherein changing SOC of the battery comprises decreasing SOC of the battery if SOC is above the desired SOC range, and increasing SOC if SOC of the battery if SOC is not above the desired SOC range.

4. The method of claim 1, wherein changing SOC of the battery is over a portion of up to about 80% of the full SOC range.

5. The method of claim 1, wherein the known Voc-SOC profile comprises a charge/discharge boundary loop.

6. The method of claim 5, wherein changing SOC comprises charging the battery to a charge profile of the boundary loop.

7. The method of claim 5, wherein changing SOC comprises discharging the battery to a discharge profile of the boundary loop.

8. The method of claim 1, wherein changing SOC comprises operating the battery with a series of micro-cycles comprising both charging and discharging.

9. The method of claim 8, wherein the series of micro-cycles are produced by operation of a regenerative drive of an elevator system.

10. A method of determining state-of-charge (SOC) of a battery, the method comprising:
    changing the SOC of the battery over a portion of a full SOC range to assure operation defined by open circuit voltage (Voc) of the battery following a known Voc-SOC profile;
    determining a Voc value;
    estimating SOC of the battery based upon the Voc value and the known Voc-SOC profile;
    wherein changing SOC comprises operating the battery with a series of micro-cycles comprising both charging and discharging;
    wherein the series of micro-cycles are produced by operation of a regenerative drive of an elevator system; and
    synchronizing the changing of SOC with a traffic profile of the elevator system.

11. The method of claim 10, wherein determining a Voc value occurs during an open circuit of short time duration by counteracting prior SOC changing trend to enhance voltage relaxation dynamics through regulating the battery usage with a reference to the traffic profile.

12. The method of claim 8, wherein determining a Voc value is based on the measured Voc and voltage relaxation characteristics of the Voc.

13. A method for determining state-of-charge (SOC) of an energy storage system of a regenerative drive elevator system, the method comprising:

performing SOC calibration by partially charging or discharging the energy storage system to assure operation defined by open circuit voltage (Voc) of the energy storage system following a known Voc-SOC profile;

measuring Voc; and estimating SOC as a function of the measured Voc based upon the known Voc-SOC profile.

14. The method of claim 13, wherein partially charging or discharging the energy storage system changes SOC by up to 80% of a full SOC range.

15. The method of claim 13, wherein the known Voc-SOC profile comprises a charge/discharge boundary loop.

16. The method of claim 13, wherein partially charging or discharging is produced by a series of micro-cycles.

17. The method of claim 16, wherein the series of micro-cycles are produced by operation of the regenerative drive elevator system along with grid power.

18. An elevator system comprising:

a regenerative drive;

a hoist motor operated by the regenerative drive;

an electrical energy storage (EES) system connected to the regenerative drive; and an EES system controller for controlling charging and discharging of the EES system as function of state-of-charge (SOC), and for performing SOC calibration by charging or discharging the EES system to a known open circuit voltage Voc-SOC boundary curve, measuring Voc of the EES system, and estimating SOC as a function of Voc and the Voc-SOC boundary curve.

19. The elevator system of claim 18, wherein the EES system controller charges or discharges the EES system during SOC calibration to produce a change of SOC of up to about 80% of a full SOC range.

20. The elevator system of claim 18, wherein the EES system controller charges or discharges the EES system during SOC calibration with a series of micro-cycles produced by operation of the regenerative drive.

21. An elevator system comprising:

a regenerative drive;

a hoist motor operated by the regenerative drive;

an electrical energy storage (EES) system connected to the regenerative drive; and an EES system controller for controlling charging and discharging of the EES system as function of state-of-charge (SOC), and for performing SOC calibration by charging or discharging the EES system to a known open circuit voltage Voc-SOC boundary curve, measuring Voc of the EES system, and estimating SOC as a function of Voc and the Voc-SOC boundary curve;

wherein the EES system controller charges or discharges the EES system during SOC calibration to produce a change of SOC of up to about 80% of a full SOC range;

wherein the EES system controller charges or discharges the EES system during SOC calibration with a series of micro-cycles produced by operation of the regenerative drive; and wherein the EES system controller synchronizes the SOC calibration with a traffic profile of the elevator system.

* * * * *